United States Patent [19]

Greenstein

[11] 4,133,000

[45] Jan. 2, 1979

[54] INTEGRATED CIRCUIT PROCESS COMPATIBLE SURGE PROTECTION RESISTOR

[75] Inventor: Eugene Greenstein, Southfield, Mich.

[73] Assignee: General Motors Corporation, Detroit, Mich.

[21] Appl. No.: 750,268

[22] Filed: Dec. 13, 1976

[51] Int. Cl.² .................. H01L 27/02; H01L 29/04
[52] U.S. Cl. .................................. 357/46; 357/40; 357/59; 357/51; 307/315
[58] Field of Search .................. 357/40, 46, 59, 51; 307/315

[56] References Cited

U.S. PATENT DOCUMENTS

| | | | |
|---|---|---|---|
| 3,519,901 | 7/1970 | Bean et al. | 357/59 |
| 3,566,200 | 2/1971 | Seidler | 307/315 |
| 3,723,833 | 3/1973 | Wheatley | 357/81 |
| 3,755,722 | 8/1973 | Harland et al. | 357/46 |
| 3,792,319 | 2/1974 | Tsang | 357/51 |
| 3,792,384 | 2/1974 | Hunt | 357/59 |
| 3,864,817 | 2/1975 | Lapham et al. | 357/59 |
| 4,001,762 | 1/1977 | Aoki et al. | 357/59 |

Primary Examiner—Andrew J. James
Attorney, Agent, or Firm—Robert J. Wallace

[57] ABSTRACT

A monolithic integrated circuit structure having an integral high value surge protection resistor of polycrystalline silicon on a thermally grown thick silicon dioxide plateau having no surface diffusion regions thereunder. The structure can be made by merely adding intermediate steps to existing integrated circuit processing. It is capable of absorbing transients of hundreds of volts.

4 Claims, 4 Drawing Figures

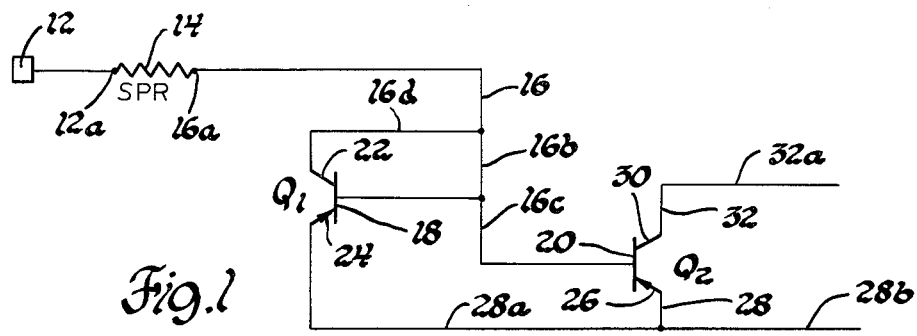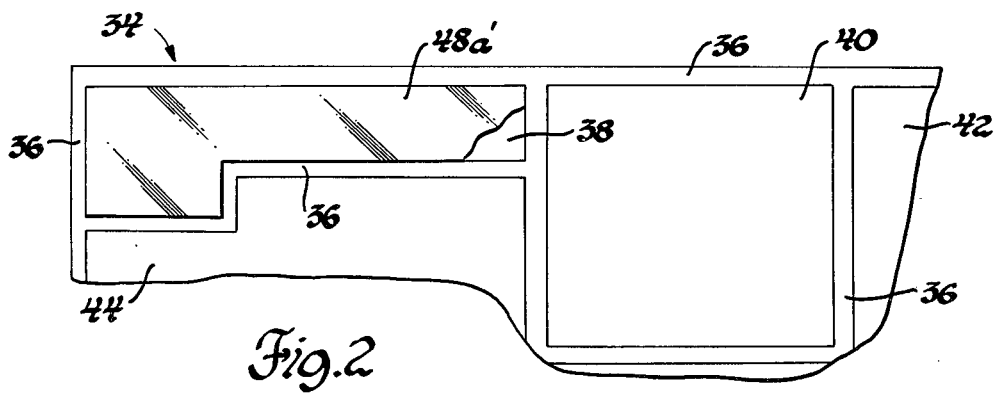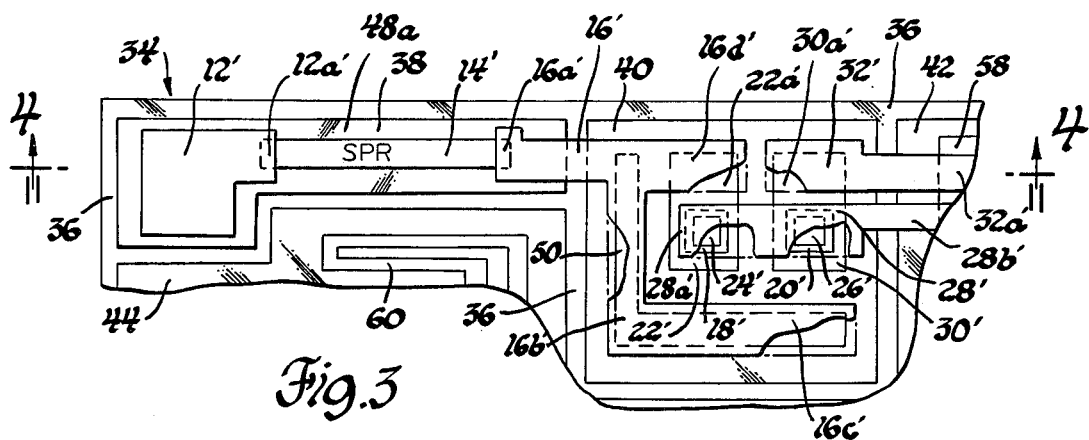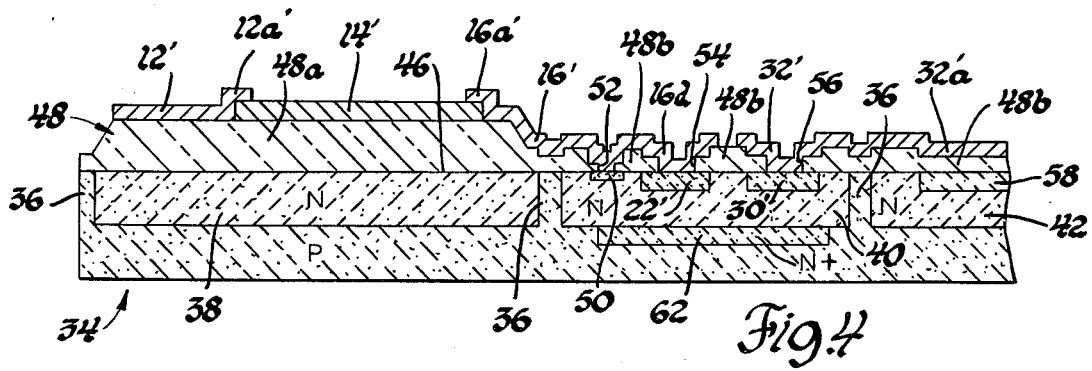

INTEGRATED CIRCUIT PROCESS COMPATIBLE SURGE PROTECTION RESISTOR

BACKGROUND OF THE INVENTION

This invention relates to a monolithic integrated circuit device having input circuitry protection integral therewith. More particularly it relates to a monolithic integrated circuit chip that includes an input resistor capable of absorbing surges of hundreds of volts.

It is known that input portions of integrated circuits may require protection from voltage surges. It is not unusual to want to include electrical components to provide such protection. If the voltage surges are fairly low, one can easily include planar-type components on the chip to absorb them. However, if the voltage surges are quite high, in excess of 50 volts, such components are not adequate.

It is not practical to include a high power zener diode on an integrated circuit chip. As a result, high voltage surge protection is conventionally not provided on the chip itself. It is normally provided in the connected external circuitry. If such protection could be provided on the chip itself, with components compatible with regular integrated circuit processing, one could increase reliability and decrease cost. An ancillary benefit, of course, is reduced size, weight and complexity of overall circuitry required.

No monolithic integrated circuit is currently available that has integral input circuitry protection capable of handling hundreds of volts. It is particularly desirable to provide such protection in automotive electrical systems, where transients of several hundreds volts are known to occur. A monolithic integrated circuit having integral input circuit protection capable of absorbing such transients may even permit such circuits to be more readily included in wiring harnesses, harness connectors and the like. This could simplify overall circuitry, lower its cost, and increase its reliability.

OBJECTS AND SUMMARY OF THE INVENTION

It is, therefore, an object of this invention to provide a monolithic integrated circuit that includes means in series with input circuitry that is capable of absorbing hundreds of volts.

It is also an object of this invention to provide a high voltage surge protection resistor in an integrated circuit structure that can be made by conventional integrated circuit processes.

A further object of this invention is to provide a method of making such products.

These and other objects of the invention are attained with a thermally grown silicon dioxide layer covering the silicon surface of an integrated circuit chip. A minor area of the layer has a significantly greater thickness than the maximum thickness of the silicon dioxide layer on the balance of the chip. The minor area thus forms a plateau of thermally grown silicon dioxide on the chip surface. A high value polycrystalline silicon resistor is disposed on the plateau, along with means, a contact pad for connecting it to the external circuitry subject to voltage surges. The contact pad is connected to one end of the resistor, and a conductor lead to chip input circuitry is connected to the other end of the resistor. The structure is compatible with integrated circuit processing in that it can be made without changing conventional integrated circuit process steps. One merely adds the steps of plateau and polycrystalline resistor formation at selected points in the otherwise conventional process.

BRIEF DESCRIPTION OF THE DRAWING

Other objects, features and advantages of the invention will become more fully appreciated from the following description of preferred embodiments and from the drawing, in which:

FIG. 1 shows an electrical schematic of an input portion of an integrated circuit chip made in accordance with this invention.

FIG. 2 shows a fragmentary plan view with parts broken away of one corner of a monolithic integrated circuit chip after a thick silicon dioxide island is formed thereon;

FIG. 3 shows a plan view of the chip portion of FIG. 2, with parts broken away, after electrical components are formed on the plateau and in the chip; and FIG. 4 shows a sectional view along the line 4—4 of FIG. 3.

DESCRIPTION OF THE PREFERRED EMBODIMENTS

FIG. 1 shows an electrical schematic of the electrical components contained in the portion of a monolithic integrated circuit chip illustrated in FIGS. 3 and 4. The schematic in FIG. 1 shows a chip input contact pad 12 connected at 12a to one end to a surge protection resistor 14 that is labelled SPR. The surge protection resistor 14 has a resistance value in excess of 50 kilo-ohms. The other end of the surge protection resistor 14 is connected at 16a to conductor 16. Conductor 16 is, in turn, connected through conductor extensions 16b and 16c to the bases 18 and 20 of P-N-P transistors Q1 and Q2, respectively. Collector 22 of transistor Q1 is connected to conductor 16 through conductor extension 16d. Thus, the base-collector junction of transistor Q1 is electrically shorted, so that transistor Q1 functions as a diode, and the collector of transistor Q1 is electrically in parallel with both transistor bases.

Emitters 24 and 26 of transistors Q1 and Q2, respectively, are electrically in parallel by means of a conductive path 28a and 28. The path has an extension 28b which leads to associated circuitry, as for example another chip contact pad for connection to a regulated power supply. Collector 30 of transistor Q2 is connected to a conductor 32 which has an extension portion 32a that leads to associated on-chip circuitry (not shown).

The electrical circuit portion illustrated in FIG. 1 is uniquely incorporated in a monolithic integrated circuit portion, as shown in FIGS. 2-4. Since this invention involves only a small portion of a silicon chip 34, FIGS. 2-4 show that portion in enlarged fragmentary views, to focus on the invention and show it more clearly. FIG. 2 shows the same portion of the silicon chip 34 illustrated in FIGS. 3 and 4 but in an intermediate phase of its manufacture. In the intermediate phase shown in FIG. 2, chip 34 has an isolation diffusion therein at portions 36 that defines N-type pockets 38, 40, 42 and 44. No device diffusions have yet been made. Chip 34 has a thermally grown silicon dioxide island 48a' thereon that is at least about 10,000 angstroms thick at this stage in chip processing. Due to further processing this thickness will increase to about 12,000–15,000 angstroms. The periphery of island 48a' is substantially coextensive with underlying pocket 38. Chip 34 is shown after the island 48a' has been defined by etching and etching maskant removed. The balance of surface 46 has no silicon dioxide coating on it at this stage of chip manufacture. Silicon dioxide is then thermally regrown on the uncovered portions of surface 46. Island 48a' becomes plateau 48a. A polycrystalline resistor 14' is later formed on plateau 48a after further processing.

FIGS. 3 and 4 show chip 34 after manufacture is completed. They show silicon chip 34 as containing an integrated circuit of diffused resistors and bipolar components interconnected by an overlying metallization. It is referred to herein as a monolithic integrated circuit of the bipolar type. Components in the balance of the chip surface (not shown) would be made in the same manner as those which are shown. Also, for added clarity, the silicon dioxide layer on chip 34 is considered transparent in FIG. 3 to better show underlying diffusion regions. Also for clarity thickness variation and surface contours are also omitted in FIG. 3.

Silicon chip 34 is a rectangular body of 10-20 ohm centimeter P-type silicon about 10 mils thick having a 0.4 mil thick epitaxial layer of 0.5-2 ohm centimeter N-type silicon thereon. Wafer and epitaxial layer thickness are not limited by this invention. Any thickness can be used that is satisfactory for the integrated circuit being made. The normal and accepted criteria for wafer and epitaxial layer thickness in a conventional integrated circuit can be used in this invention.

A P-type isolation diffusion through selected portions 36 of the epitaxial layer forms a plurality of N-type pockets in the epitaxial layer, including L-shaped pocket 38 and rectangular pocket 40. Additional N-type pockets 42 and 44 are only partially shown. The entire surface 46 of chip 34 is covered with a thermally grown silicon dioxide layer 48. A portion 48a of this silicon dioxide layer is substantially coextensive with the chip surface 46 over pocket 38 and has a thickness of at least about 10,000 angstroms, preferably about 12,000-15,000. All other portions 48b of this silicon dioxide layer have a significantly lesser thickness of about 2,000 to 8,000 angstroms. For example, pockets 40, 42 and 44 and all other pockets on the chip having components formed therein by diffusion will have a thermally grown silicon dioxide layer 48b of less than 8,000 angstroms. The significantly thicker portion 48a thus forms a plateau in silicon dioxide layer 48, and corresponds to the island 48a shown in FIG. 2.

All of the N-type pockets in chip 34 have surface diffusion regions therein forming electrical components for the monolithic integrated circuit. Two lateral P-N-P transistors are formed in pocket 40 in a concentric pattern. N-type pocket 40 contains two rectangular generally ring-like P-type regions 22' and 30' inset therein. Each of regions 22' and 30' have one side widened at 22a' and 30a', respectively, to facilitate making electrical connections to them. Regions 22' and 30', respectively, form the collector 22 and collector 30 of transistors Q1 and Q2. Island-like P-type regions 24' and 26' are inset within and inwardly spaced from the inner periphery of ring-like regions 22' and 30', respectively. They respectively serve as emitters 24 and 26 for transistors Q1 and Q2. Pocket 40 thus serves as a base region common to both of transistors Q1 and Q2. Pocket 40 contains an L-shaped N+ region 50 inset therein beneath conductor extensions 16b and 16c for making an ohmic contact to pocket 40. The part 18' of pocket 40 between regions 22' and 24' thus serves as a base region for transistor Q1. Analogously, the part 20' of pocket 40 between regions 26' and 30' serves as a base region for transistor Q2. All of these regions in the pockets are formed by diffusion into the pocket through surface 46, and are covered with a thinner thermally grown silicon dioxide coating 48b. A buried N+ layer 62 is beneath pocket 40, to facilitate lateral transistor action of transistors Q1 and Q2.

Plateau 48a of the thermally grown silicon dioxide has a surge protection resistor 14' labelled SPR thereon in the form of a coating about 0.8 micron to 1.2 micron thick of polycrystalline silicon. The polycrystalline silicon coating has a sheet resistance of at least about 10 kilo-ohms per square, preferably 10-20 kilo-ohms per square and is about 8,000-12,000 angstroms thick. It is in an elongated pattern defining a surge protection resistor 14' with a value of at least about 50 kilo-ohms, preferably 100 kilo-ohms. One end of the resistor 14' is overlapped by an extension 12a' of an evaporated aluminum input contact 12'. Like resistor 14', contact 12' is disposed entirely on plateau 48a of the silicon dioxide layer. The other end of surge protection resistor 14' is overlapped by portion 16a' of an evaporated aluminum conductor 16'. The second and third extensions 16b' and 16c' of conductor 16' cover the N+ region 50, and make ohmic contact to pocket 40. A fourth extension 16d' of conductor 16 makes ohmic contact with side 22a' of the collector region 22' of transistor Q1.

Evaporated aluminum conductors 16b' and 16c' communicate with region 50 of pocket 40 through an L-shaped aperture 52 in the overlying thinner portion 48b of the silicon dioxide layer. Analogously, extension 16d contacts collector region 22' through an aperture 54 in the thin portion 48b. An evaporated aluminum conductor segment 32' contacts collector region 30' through an aperture 56 in the thin oxide 48b. It has an extension 32a' leading to other circuitry on the chip, such as another transistor region 58 in pocket 42 or diffused resistor 60 in pocket 44. An evaporated aluminum conductor segment 28a' and 28' contacts emitter regions 24' and 26', respectively, through apertures (not shown) in the interjacent thin oxide 48b. An extension 28b' leads to other portions of the chip, as for example a contact pad for connection to a regulated voltage source.

As previously noted, plateau 48a of the silicon dioxide layer 48 is significantly thicker than other portions 48b covering other parts of chip surface 46. If greater than about 10,000 angstroms, it can withstand hundreds of volts without dielectric breakdown between pocket 38 and the overlying surge protection resistor 14'. If no electrical components are formed in pocket 38, field effects in pocket 38 due to voltage surges cannot produce circuit abnormalities of any kind. Surges of hundreds of volts applied to input contact 12' can be readily absorbed by the surge protection resistor 14' without deleterious affects.

The foregoing structure can be made by a conventional integrated circuit process to which plateau and resistor formation steps are added. The initial thickness of plateau 48a is formed by extended oxidation of the silicon surface prior to the isolation diffusion. It is the only portion of the thermally grown silicon dioxide coating retained intact during the remainder of processing. The configuration of the diffusion regions forming integrated circuit components in other wafer portions, as well as the manner of making such diffusions, is not material to this invention. Any wafer or region resistivity, configuration, and diffusion technique one would otherwise employ, if this invention were not incorporated in the chip, can be used. No change in any of such diffusions is required to make them compatible with this invention. It is inherently compatible with whatever specific integrated circuit process is desired.

To illustrate this compatibility is the following description of one such process. A 10–20 ohm centimeter P-type silicon wafer is used that is large enough to contain a plurality of integrated circuit chips simultaneously formed therein. An N+ region 62 is diffused into a selected part of each chip area that is to lie beneath pocket 40 when it is formed. Then a 1–2 ohm centimeter N-type silicon layer is epitaxially deposited onto the wafer, burying the N+ region. The epitaxial layer is about 0.4 mils thick and the wafer is about 10 mils thick. The wafer is then oxidized to a thickness of at least about 8,000 angstroms, preferably 10,000 angstroms and photolithographically masked. Any of the normal and accepted techniques for producing a thick, adherent, dense and pin-hole free layer of thermally grown silicon dioxide can be used. For example, the wafer can be heated to a temperature of approximately 1100° C. in wet oxygen for about 100 minutes. It is etched in buffered hydrofluoric acid to remove the silicon dioxide from selected surface areas, to produce a mask for diffusion of the isolation walls 36 through the epitaxial layer. A P-type impurity such as boron is then diffused into the exposed surface areas to form the isolation walls 36, and divide the epitaxial layers into a plurality of PN junction isolated N-type pockets, such as 38, 40 and 42. It is conventional to regrow silicon dioxide on the previously exposed wafer surface areas during drive-in of the P-type impurity, to protect the wafer surface 46. The regrown silicon dioxide over the isolation diffusion regions is about 4000–6000 angstroms thick.

A portion 48a' of the silicon dioxide coating is then selectively covered with a photoresist. This portion is in register with N-type pocket 38. The wafer is then etched in buffered hydrofluoric acid to strip all of the exposed original and regrown thermal oxide not covered by the photoresist. This leaves an island 48a' of silicon dioxide over and coextensive with N-type pocket 38. A layer of about 4,000–6,000 angstroms of silicon dioxide is then thermally regrown on the wafer surface areas from which it was just removed. The island portion increases in thickness during this step. It is about 10,000 angstroms or more in thickness at this point, and forms a plateau 48a with respect to the reformed silicon dioxide 48b on other portions of wafer surface 46.

The wafer is then photolithographically masked and etched in hydrofluoric acid to re-expose the isolation diffusion regions and to open windows over regions where a shallower P-type diffusion is desired for masking the transistor region. This diffusion is referred to as the base diffusion for vertical N-P-N transistors. The isolation diffusion regions are exposed in this step, as usual, to reinforce surface doping. A P-type impurity such as boron is then diffused through the openings in the silicon dioxide and, as described before, a silicon dioxide coating is regrown in these openings during drive-in of the boron. The wafer is then photolithographically masked and etched again in buffered hydrofluoric acid to expose wafer surface areas covered by only the thin silicon dioxide layer where a low resistance contact region, or an emitter in a vertical N-P-N transistor is desired. Phorphorus is diffused into these regions and a silicon dioxide layer concurrently regrown in the openings. At this point, the entire surface of the wafer is covered with a thermally grown silicon dioxide layer. In plateau area 48a, the silicon dioxide layer is preferably greater than 12,000 angstroms and of uniform thickness. In other areas 48b, it is of non-uniform thickness, and is less than about 8,000 angstroms.

A polycrystalline silicon coating is then deposited onto plateau 48a. The particular manner of depositing the polycrystalline silicon is not significant so long as it produces a resistive coating on plateau 48a of the desired sheet resistance. The polycrystalline silicon can be applied by sputtering, vacuum deposition or chemical vapor phase deposition. I prefer to use thermal decomposition of silane, with argon as the carrier gas, to deposit the polycrystalline silicon layer. Boron ion implantation can be used to precisely adjust the polycrystalline silicon to a specifically desired sheet resistance after it is deposited. The resistor pattern can be defined in any convenient manner. I prefer to deposit a blanket coating onto the entire surface and selectively etch unwanted portions of the blanket coating away. It can be plasma etched or etched in a wet chemical technique. The etch used is not important. For wet chemical etching a silicon dioxide layer is usually required on top of the polysilicon to act as a mask.

Contact windows are then opened in the thin oxide portions 48b on wafer surface 46 using photolithography techniques. A blanket deposition of aluminum is made and unwanted portions etched away to form the conductors such as 16', 28' and 32', and the contact pads such as 12'. Scratch protection is obtained by depositing a blanket coating of a low temperature phosphorus doped glass or its equivalent onto the entire chip surface. Windows over the contact pads are then opened in this latter coating using photolithography, so the contact pads are exposed for bonding.

The foregoing description shows how this invention is incorporated in a bipolar integrated circuit. It can also be readily incorporated in an integrated circuit of field effect devices, including silicon gate metal-insulator-semiconductor devices. Further, plateau 48a was described as being formed before the isolation diffusion, which is preferred. However, it can also be formed between the isolation diffusion and the base diffusion steps.

I claim:

1. A unitary semiconductor integrated circuit self-protected as to voltage surge comprising a body of semiconducting material, means defining a semiconductor junction having silicon dioxide insulation layer thereover with at least one overlaid conductor connected thereto at one part of said body, wherein a voltage surge directly applied to said conductor can deleteriously affect at least one of the conductor, the silicon dioxide layer and the semiconductor body, said body having a thermally grown silicon dioxide layer contiguous and integral with said first-mentioned silicon dioxide layer at said one part and of substantially greater thickness than any portion of said first-mentioned silicon dioxide layer, means defining a resistance layer that is wholly over said last-mentioned silicon dioxide layer and connected at one end to said conductor, the other end of said resistance layer being adapted for connection to a circuit apparatus subject to voltage surges, the resistance value of said resistance layer between its ends being so related to the conductivity of the junction that a voltage drop across the resistance layer absorbs the voltage surges.

2. The integrated circuit self-protected as to voltage surge defined in claim 1 in which said resistance material is polycrystalline silicon having a sheet resistance of at least 10 kilo-ohms per square.

3. A monolithic integrated circuit structure that includes an integral high value resistor for protecting input portions of the integrated circuit from periodic high voltage surges and which structure can be conveniently made using monocrystalline integrated circuit commercial production techniques, said integrated circuit structure comprising:

a silicon wafer having a surface;

a thermally grown silicon dioxide layer on said wafer surface having a first portion of a thickness up to about 8,000 angstroms and covering a major area of said wafer surface, and a second portion of a thickness greater than about 10,000 angstroms and covering a minor area of said wafer surface;

semiconductor signal translating devices in said wafer having regions intersecting said wafer surface under said first portion of said silicon dioxide layer;

an approximately 8,000–12,000 angstroms thick layer of polycrystalline silicon having a resistivity of at least about 10 kilo-ohms per square disposed entirely on said second portion of said silicon dioxide layer and forming a surge protection resistor with a value of at least about 50 kilo-ohms;

a segmented metal coating on said silicon dioxide layer in a pattern of contact pads and conductors;

one of said contact pads disposed entirely on said second portion of said silicon dioxide layer for receiving an input signal from a source subject to exhibit voltage surges and contacting a first part of said polycrystalline silicon surge protection resistor;

one of said conductors electrically interconnecting a second part of said polycrystalline surge protection resistor and at least one input device in said wafer whereby said input signal contact pad and said input device are connected in series through said surge protection resistor so that a voltage drop across said surge protection resistor absorbs voltage surges applied to said contact pad.

4. A monolithic integrated circuit structure that includes an integral polycrystalline silicon high value resistor for protecting input portions of the integrated circuit from periodic high voltage surges and which structure can be conveniently made using monocrystalline integrated circuit commercial production techniques, said integrated circuit structure comprising:

a silicon wafer having an oxidized surface forming a silicon dioxide layer thereon;

a first portion of said silicon dioxide layer having a thickness up to about 8000 angstroms, and covering a major area of said wafer surface;

a second portion of said silicon dioxide layer having an unusually high thickness of at least about 12,000 angstroms, and covering a minor area of said wafer surface;

semiconductor signal translating devices in said wafer having diffused regions intersecting said wafer surface;

all of said regions of said signal translating devices intersecting said wafer surface outside said minor surface area covered by said unusually thick silicon dioxide layer portion;

an approximately 8000–12,000 angstroms thick layer of polycrystalline silicon having a resistivity at least about 20 kilo-ohms per square disposed entirely on said unusually thick portion of said silicon dioxide layer in an elongated pattern forming a surge protection resistor with a value of at least about 50 kilo-ohms;

a segmented metal coating on said silicon dioxide layer in a pattern of contact pads for connection to external circuitry and of conductors for interconnecting wafer devices and contact pads, with at least said conductors in low resistance electrical communication with selected device regions through apertures in said silicon dioxide coating;

one of said contact pads for receiving an input signal from circuit apparatus that may exhibit power surges in excess of about 100 volts;

said input signal contact pad disposed entirely on said unusually thick silicon dioxide layer portion and contacting one end of said elongated polycrystalline surge protection resistor;

one of said conductors for receiving said input signal from said input signal contact pad and conveying it to at least one input device in said wafer;

a part of said conductor on said unusually thick silicon dioxide layer portion spaced from said input signal contact pad and contacting the opposite end of said elongated polycrystalline surge protection resistor;

a portion of said conductor extending down from said unusually thick silicon dioxide layer portion onto its first portion into low resistance electrical communication with at least one input device in said integrated circuit through an aperture in the first portion of said silicon dioxide layer, whereby said input signal contact pad and said input device are connected in series through said surge protection resistor for absorption of voltage surges from said circuit apparatus.

* * * * *